（12） United States Patent
Park et al.

(10) Patent No.: US 8,124,478 B2
(45) Date of Patent: Feb. 28, 2012

(54) METHOD FOR FABRICATING FLASH MEMORY DEVICE HAVING VERTICAL FLOATING GATE

(75) Inventors: Jung Woo Park, Seoul (KR); Sung Yoon Cho, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 207 days.

(21) Appl. No.: 12/494,826

(22) Filed: Jun. 30, 2009

(65) Prior Publication Data

US 2010/0003795 A1 Jan. 7, 2010

(30) Foreign Application Priority Data

Jul. 7, 2008 (KR) .................. 10-2008-0065699

(51) Int. Cl.
*H01L 29/788* (2006.01)
(52) U.S. Cl. ........ 438/268; 257/314; 257/324; 438/593; 438/265; 438/257
(58) Field of Classification Search .................. 257/314, 257/324; 438/257, 265, 268, 593
See application file for complete search history.

(56) References Cited

U.S. PATENT DOCUMENTS

| 2005/0063237 A1* | 3/2005 | Masuoka et al. ............. 365/222 |
| 2007/0272973 A1* | 11/2007 | Park et al. ..................... 257/324 |
| 2008/0099830 A1* | 5/2008 | Lue et al. ...................... 257/324 |
| 2008/0149992 A1* | 6/2008 | Gidon ........................... 257/316 |
| 2008/0173928 A1 | 7/2008 | Arai et al. |
| 2008/0277720 A1* | 11/2008 | Youn et al. .................... 257/324 |
| 2009/0026460 A1 | 1/2009 | Ou et al. |

FOREIGN PATENT DOCUMENTS

| KR | 10-2005-0028886 | 3/2005 |
| KR | 10-2007-0096972 | 10/2007 |
| KR | 10-2007-0114185 | 11/2007 |
| KR | 10-2008-0001284 | 1/2008 |

OTHER PUBLICATIONS

Takuya Ohba et al., "A novel tri-control gate surrounding gate transistor (TCG-SGT) nonvolatile memory cell for flash memory." Solid-State Electronics 50 (2006) 924-928.*

* cited by examiner

*Primary Examiner* — N Drew Richards
*Assistant Examiner* — Peter Bradford
(74) *Attorney, Agent, or Firm* — Marshall, Gerstein & Borun LLP

(57) ABSTRACT

A method for fabricating a flash memory device includes forming a control gate having a hollow donut shape over an insulation layer formed over a substrate. The method also includes forming an inter-poly dielectric of a spacer shape on an inner wall of the control gate, filling a conductive layer for a floating gate between the spacer shaped inter-poly dielectrics, and forming an interlayer insulation layer over a resulting product formed with the conductive layer for a floating gate. The method further includes removing a center portion of the conductive layer for a floating gate to form an opening, forming a tunnel insulation layer on an inner face of the opening, and filling with a semiconductor layer the opening formed with the tunnel insulation layer to form an active region.

8 Claims, 6 Drawing Sheets

METHOD FOR FABRICATING FLASH MEMORY DEVICE HAVING VERTICAL FLOATING GATE

CROSS-REFERENCE TO RELATED APPLICATION

The priority of Korean patent application No. 10-2008-0065699 filed on Jul. 7, 2008, the entire disclosure of which is incorporated by reference, is claimed.

BACKGROUND OF THE INVENTION

1. Field of the Invention

The invention generally relates to a method for fabricating a flash memory device and, more particularly, to a method for fabricating a flash memory device having a floating gate of a vertical structure.

2. Brief Description of Related Technology

A semiconductor memory device used for storing data can generally be divided into a volatile memory device and a non-volatile memory device. The volatile memory device loses the stored data when the power supply is interrupted, but the non-volatile memory device retains the stored data even when the power supply is interrupted. Therefore, the non-volatile memory device is widely used in applications where power is not always available, the power is occasionally interrupted or lower power consumption is required as in a mobile phone system, a memory card for storing music and/or movie data and other appliances. A typical example is a flash memory device.

The flash memory device is, like a general non-volatile memory device, formed of cell transistors having a stacked gate structure. The stacked gate structure refers to a structure where a tunnel oxide layer, a floating gate, an inter-poly dielectric (IPD), and a control gate are sequentially stacked on a channel region of the cell transistor. The flash memory device of such stacked gate structure uses a coupling ratio, by which a voltage is applied to the floating gate via the inter-poly dielectric when applying a predetermined voltage.

Meanwhile, with miniaturization and weight reduction of electronic appliances, there is an increased demand for a cell of a smaller size, even in the flash memory device. However, it is difficult to meet this demand with current two dimensional cell structure and a novel cell structure thus should be studied.

SUMMARY OF THE INVENTION

Embodiments of the present invention are directed to a method for fabricating a flash memory device capable of drastically increasing an integration degree of a memory cell without limitation due to an area of a semiconductor substrate by realizing the memory cell in a vertical direction to the substrate.

In one embodiment, a method for fabricating a flash memory device includes forming a control gate having a hollow donut shape over an insulation layer deposited on a substrate; forming an inter-poly dielectric having a spacer shape on an inner wall of the control gate; filling a conductive layer for a floating gate between the spacer shaped inter-poly dielectrics; forming an interlayer insulation layer over a resulting product, the interlayer insulation layer including the conductive layer for a floating gate; removing a center portion of the conductive layer for a floating gate to form an opening; forming a tunnel insulation layer on an inner face of the opening; and filling with a semiconductor layer the opening formed with the tunnel insulation layer with a semiconductor layer to form an active region.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
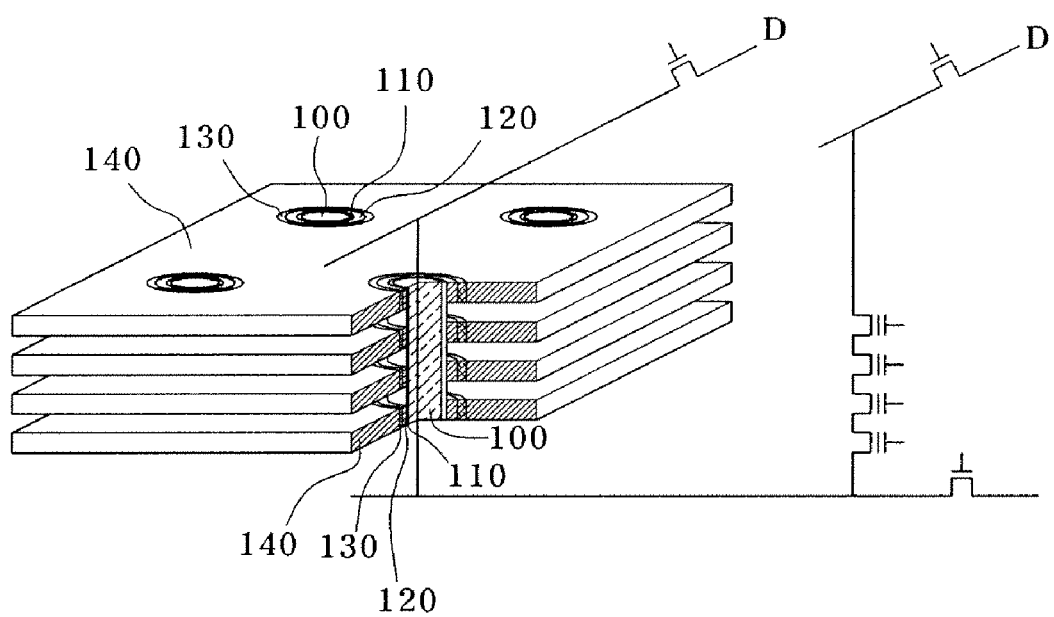
FIG. 1 is a perspective view illustrating a flash memory device having a vertical floating gate in accordance with an embodiment of the present invention.

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DESCRIPTION OF SPECIFIC EMBODIMENTS

Figure 2:
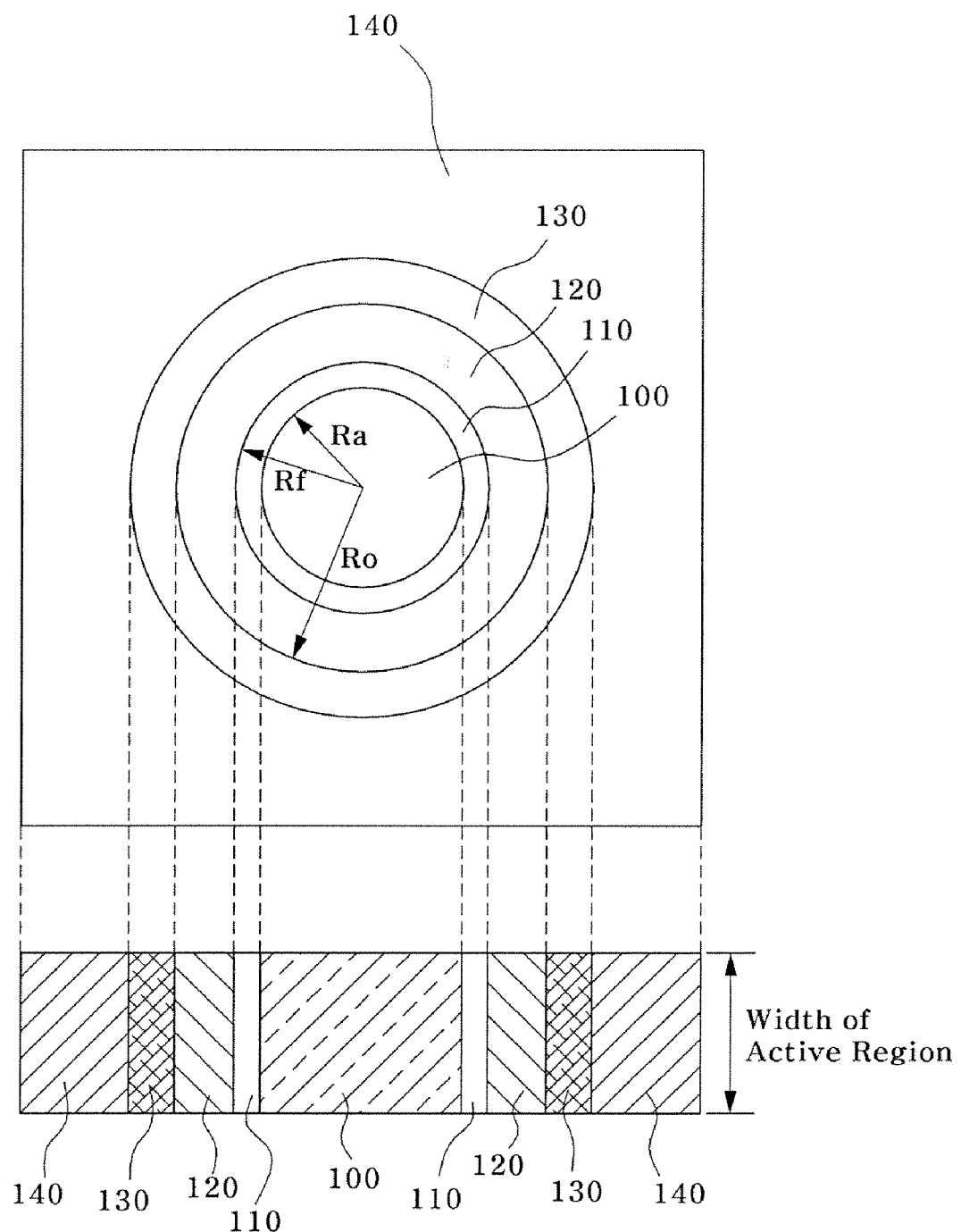
FIG. 2 is a plan view and a cross-sectional view illustrating the flash memory device having a vertical floating gate in accordance with an embodiment of the present invention; and, FIGS. 3 through 8 are cross-sectional views illustrating a method for fabricating the flash memory device in accordance with an embodiment of the present invention.

Referring to FIGS. 1 and 2, a tunnel insulation layer 110, a floating gate 120, an inter-poly dielectric layer 130 and a control gate 140 are disposed concentrically around a cylindrical active region 100. Particularly, the active region 100 has a cylindrical shape, but respective gate patterns formed in such a manner that the tunnel insulation layer 110, the floating gate 120, the inter-poly dielectric layer 130 and the control gate 140, concentrically disposed, are, unlike the active region, divided into a plurality of layers by an interlayer insulation layers (not shown). The gate patterns that share one cylindrical active region 100 are divided by the interlayer insulation layers form one cell string. Memory cells connected to one cell string share source (not shown) and drain formed in the cylindrical active region.

As such, it is possible to increase degree of integration in a flash memory device by constructing the cell stacks in a three dimensional vertical structure. In other words, it is possible to reduce an area occupied by the memory cell for obtaining a desired capacitance. In FIG. 2, a coupling ratio of the floating gate 120 is equal to $R_o/R_a$ and a capacitance of the floating gate is $n(R_o^2-R_f^2)$.

Also, the active regions are divided more effectively by constructing the active region in a cylindrical shape, thereby capable of preventing short channel effect. Further, it is possible to realize larger width of the active region with the same size by constructing the cell stack concentrically and it is possible to ensure a sufficient length of the active region by stacking the gate pattern vertically.

FIGS. 3 through 8 are cross-sectional views illustrating a method for fabricating the flash memory device in accordance with an embodiment of the present invention.

Figure 3:
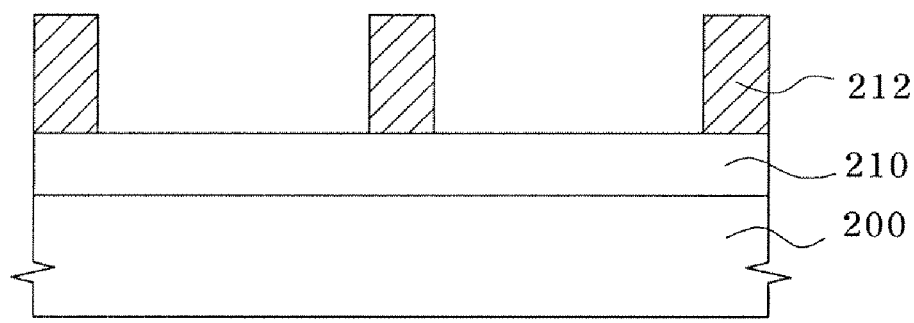

Referring to FIG. 3, an insulation layer 210 is formed over a semiconductor substrate 200 in which an active region is defined, and a conductive layer is then deposited over the insulation layer 210. The conductive layer can be formed, for example, by depositing a polysilicon layer doped with impurities by chemical vapor deposition (CVD).

A hard mask (not shown) for gate patterning is formed over the conductive layer. The hard mask (not shown) is formed circularly as shown in FIGS. 1 and 2 to form a gate in a three dimensional shape. Next, the conductive layer is anisotropically etched using the hard mask as an etch mask to form a control gate 212 of a hollow donut shape.

Figure 4:
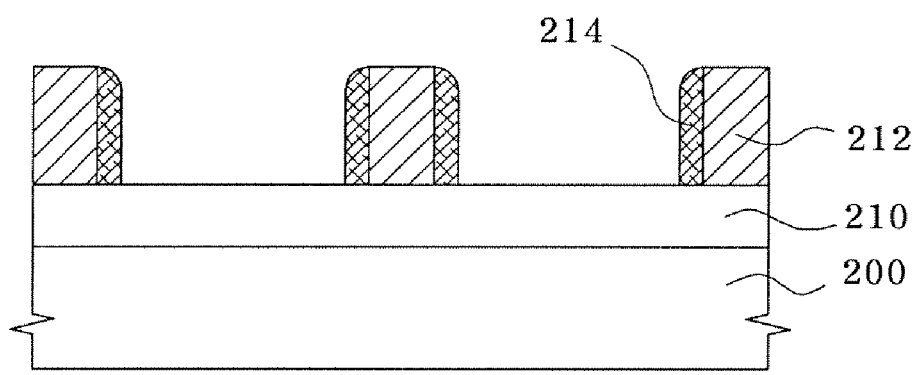

Referring to FIG. 4, an inter-poly dielectric 214 is formed over the resulting product formed with the control gate 212. The inter-poly dielectric 214 can be formed, for example, in an ONO structure by stacking oxide layer/nitride layer/oxide layer sequentially. Next, an etch process such as an etch back is performed on the inter-poly dielectric 214 to remove the portions of the inter-poly dielectric formed over the upper portion of the control gate 212 and the inner bottom of the control gate 212. Then, the inter-poly dielectric 214 having a spacer shape that surrounds the inner wall and outer wall of the donut shaped control gate 212 is formed as shown.

Figure 5:
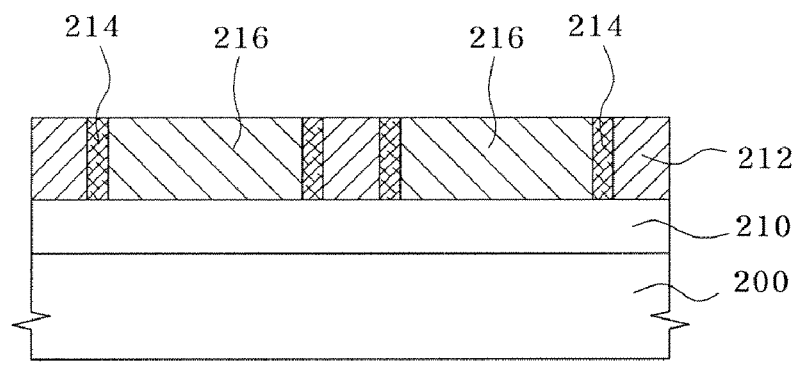

Referring to FIG. 5, a conductive layer for a floating gate, for example, a polysilicon layer doped with impurities, is formed over the resulting product. At this time, the conductive layer is formed to a sufficient thickness so as to sufficiently fill between the control gates 121 and cover the control gate 212. Next, a planarization process such as chemical mechanical polishing (CMP) is performed on the conductive layer to expose the surface of the control gate 212, thereby forming a floating gate 216. Then, the control-gate 212 and the floating gate 216 are electrically isolated from each other.

Figure 6:
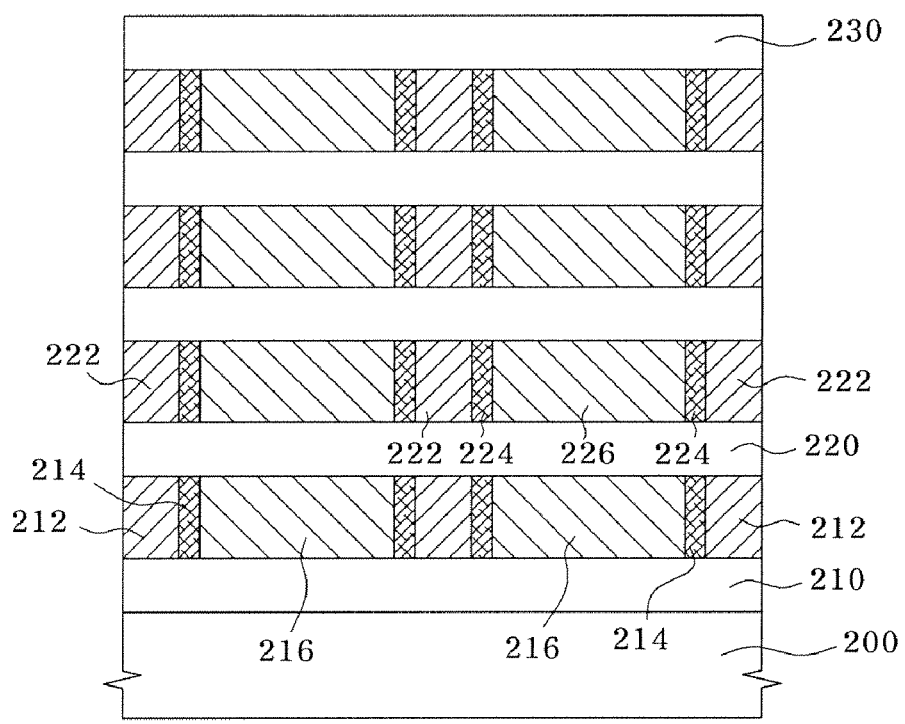

Referring to FIG. 6, an insulation layer (e.g., an oxide layer) is formed over the entire face of the resulting product to form an interlayer insulation layer 220. This interlayer insulation layer 220 functions to divide the control gate in the lower layer and the control gate in the upper layer, the floating gate in the lower layer and the floating gate in the upper layer, respectively.

Over the interlayer insulation layer 220, the process of forming the control gate, the inter-poly dielectric and the floating gate in the lower layer is repeated again. In other words, a conductive layer is deposited over the interlayer insulation layer 220 and then etched back to form the upper control gate 222. An ONO layer of a spacer shape is then formed on the inner and outer walls of the control gate to form an inter-poly dielectric 224. Subsequently, a conductive layer for a floating gate is deposited and a CMP process is then performed. As the result, an upper structure having a floating gate 226 is formed like the lower structure.

As such, the processes of FIGS. 3 to 5 are performed repeatedly, and a structure of a desired number of layers can be formed by repeating the processes a number of times corresponding to a number of memory cells connected to the cell string, i.e. 8 times, 16 times, 32 times, 64 times or the like. In the present embodiment, a four-layer structure is exemplarily shown. After the structure of desired layers is formed, an interlayer insulation layer 20 is formed over an entire surface.

Figure 7:
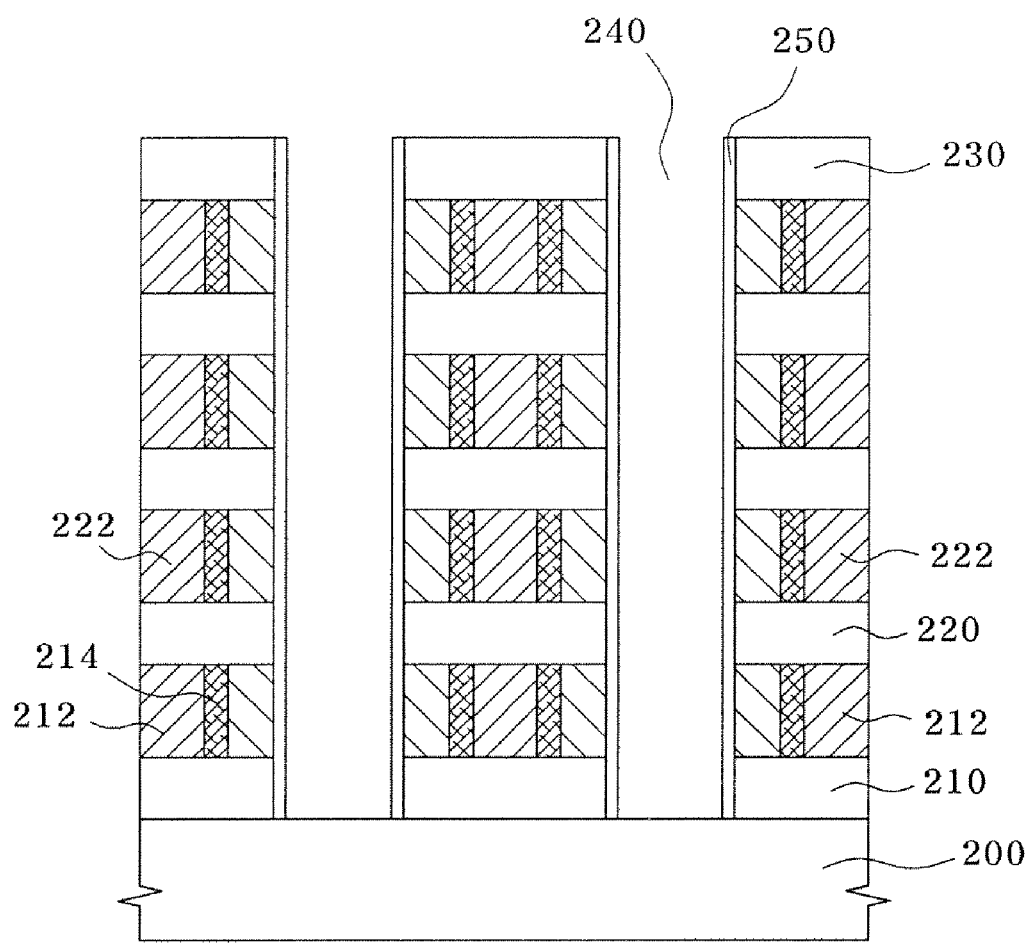

Referring to FIG. 7, a photo process is performed using a mask that defines the active region to form a photoresist pattern (not shown) for defining the active region over the interlayer insulation layer 230. The photoresist pattern is formed in a shape that exposes a circular region inside the cylindrical floating gate (120 in FIG. 2) as shown in FIG. 2. Next, the interlayer insulation layers and floating gates stacked in multiple layers are sequentially etched using the photoresist pattern as an etch mask. Then, an inside of the floating gate is removed and the floating gate comes to have a donut shape with an opening 240.

Figure 8:
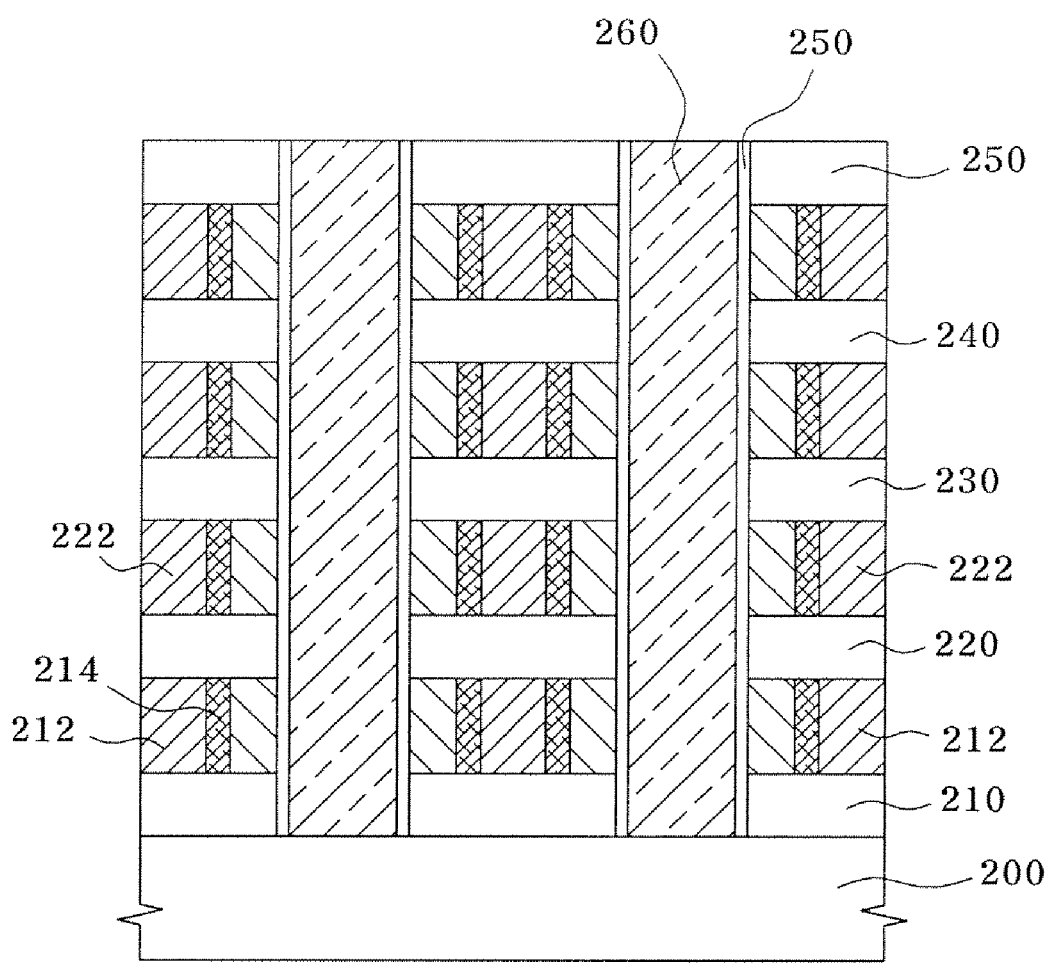

Referring to FIG. 8, for example, an oxide layer is deposited over the resulting product in which the inside of the floating gate is etched, and an etch back is performed thereon to form a tunnel insulation layer 250. At this time, the portions of the tunnel insulation layer over the surface of the semiconductor substrate 200 and the upper portion of the uppermost interlayer insulation layer 230 are removed, and the tunnel insulation layer 250 is formed in a spacer shape only on the side wall of the opening 240 formed in FIG. 7.

Next, an active region 260 is formed in the opening formed with the tunnel insulation layer. The active region 260 can be formed, for example, by growing a single crystalline silicon layer with an epitaxial growth or by depositing a polysilicon layer. Besides, it is also possible to form the active region by various well known methods. Next, the silicon layer formed over the uppermost interlayer insulation layer 230 is removed to divide the active regions.

As is apparent from the above description, it is possible to increase the integration degree of a memory device by constructing the cell stack in a three dimensional vertical structure. Also, it is possible to divide the active regions more effectively by constructing the active region in a cylindrical shape, thereby capable of preventing short channel effect. Further, it is possible to realize larger width of the active region with the same size by constructing the cell stack concentrically and it is possible to ensure an enough length of the active region by stacking the gate pattern vertically.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a flash memory device, the method comprising:
    forming a control gate having a hollow donut shape over an insulation layer deposited over a substrate;
    forming an inter-poly dielectric having a spacer shape on inner sidewalls of the control gate, wherein the inter-poly dielectric surrounds a hole;
    forming a floating gate by depositing a conductive material until the hole surrounded by the inter-poly dielectric on the sidewalls of the control gate is filled;
    forming an interlayer insulation layer over a resulting structure including the floating gate;
    removing a center portion of the floating gate to form an opening, wherein the opening exposes inner sidewalls of the floating gate;
    forming a tunnel insulation layer on an inside of the opening; and,
    filling the opening with a semiconductor layer to form an active region.

2. The method of claim 1, wherein the forming of the inter-poly dielectric comprises:
    forming a dielectric layer over the insulation layer formed with the control gate; and
    performing an etching process on the dielectric layer to remove portions of the dielectric layer to expose upper surfaces of the insulation layer and the control gate.

3. The method of claim 2, wherein the dielectric layer comprises a structure of oxide layer/nitride layer/oxide layer.

4. The method of claim 1, wherein the forming the active region comprises:
    forming a semiconductor layer inside the opening; and,
    planarizing the semiconductor layer.

5. The method of claim 4, wherein the forming of the semiconductor layer comprises growing a silicon epitaxial layer or depositing a polysilicon layer.

6. The method of claim 1 further comprising, after forming the interlayer insulation layer over the resulting structure including the floating gate, repeating forming the control gate, the inter-poly dielectric, the floating gate, and the interlayer insulation layer a predetermined number of times to form a multiple structure, wherein the control gate having the hollow donut shape is formed on the interlayer insulation layer by depositing a polysilicon layer on the interlayer insulation layer and etching the polysilicon layer to expose a portion of a surface of the interlayer insulation layer, the inter-poly dielectric having the spacer shape is formed on the inner side walls of the control gate, and the floating gate is formed by depositing the conductive material on the interlayer insulation layer until the hole surrounded by the inter-poly dielectric is filled.

7. The method of claim 6, comprising repeating the forming of the control gate, the inter-poly dielectric, the floating gate, the tunnel insulation layer, and the interlayer insulation layer a number of times corresponding to a number of memory cells connected to one cell string.

8. The method of claim 1, wherein the semiconductor layer acts as a channel.

* * * * *